United States Patent
Davidi et al.

(10) Patent No.: US 12,198,037 B2
(45) Date of Patent: Jan. 14, 2025

(54) HARDWARE ARCHITECTURE DETERMINATION BASED ON A NEURAL NETWORK AND A NETWORK COMPILATION PROCESS

(71) Applicant: SAMSUNG ELECTRONICS CO., LTD., Suwon-si (KR)

(72) Inventors: Or Davidi, Tel-Aviv (IL); Omer Shabtai, Tel-Aviv (IL); Yotam Platner, Tel-Aviv (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1105 days.

(21) Appl. No.: 17/091,633

(22) Filed: Nov. 6, 2020

(65) Prior Publication Data

US 2022/0147801 A1     May 12, 2022

(51) Int. Cl.
*G06N 3/063*     (2023.01)
*G06F 8/41*     (2018.01)
(Continued)

(52) U.S. Cl.
CPC .............. *G06N 3/063* (2013.01); *G06F 8/41* (2013.01); *G06F 30/34* (2020.01); *G06N 3/04* (2013.01)

(58) Field of Classification Search
CPC .......... G06N 3/063; G06N 3/04; G06N 3/045; G06N 3/126; G06N 3/10; G06N 5/01;
(Continued)

(56) References Cited

U.S. PATENT DOCUMENTS

| | | | |
|---|---|---|---|
| 2018/0157965 A1* | 6/2018 | Sun | G06N 3/045 |
| 2018/0189638 A1* | 7/2018 | Nurvitadhi | G06N 3/063 |

(Continued)

OTHER PUBLICATIONS

Kolala Venkataramanaiah, Yufei Ma, Shihui Yin, Eriko Nurvithadhi*, Aravind Dasu †, Yu Cao, Jae-sun Seo, "Automatic Compiler Based FPGA Accelerator for CNN Training," 2019 29th International Conference on Field Programmable Logic and Applications (FPL) (Year: 2019).*

(Continued)

*Primary Examiner* — Steven W Crabb
(74) *Attorney, Agent, or Firm* — CHAU & ASSOCIATES, LLC

(57) ABSTRACT

The described techniques provide for an automated process of hardware design using main applications (e.g., use cases) and a modeling heuristic of a compiler. Hardware may be optimized and designed based on the knowledge of the compiler for the hardware and firmware information. For instance, a user may define constraints (e.g., area constraints, power constraints, performance constraints, accuracy degradation constraints, etc.) and the changes of compilation heuristics and hardware parameters may be optimized to efficiently achieve the user defined constraints. Accordingly, hardware configuration parameters may be optimized based on the neural network's compilation process (e.g., actual compiler constraints) and optimization of power, performance, and area (PPA) constraints (e.g., user defined constraints). Specific neural processor (SNP) hardware may thus be designed based on the optimized hardware configuration parameters (e.g., via modeling heuristics of its compiler and main applications informed via user defined constraints or PPA constraints).

18 Claims, 6 Drawing Sheets

(51) Int. Cl.
*G06F 30/34* (2020.01)
*G06N 3/04* (2023.01)

(58) Field of Classification Search
CPC .......... G06F 8/41; G06F 30/34; G06F 30/398; G06F 30/392; G06F 2115/10; G06F 2119/18
See application file for complete search history.

(56) References Cited

U.S. PATENT DOCUMENTS

2019/0286984 A1* 9/2019 Vasudevan ............... G06N 5/01
2020/0082247 A1* 3/2020 Wu ........................ G06N 3/045

OTHER PUBLICATIONS

Naveen Suda, Vikas Chandr ‡, Ganesh Dasika, Abinash Mohanty, Yufei Ma, Sarma Vrudhula †, Jae-sun Seo, Yu Cao, "Throughput-Optimized OpenCL-based FPGA Accelerator for Large-Scale Convolutional Neural Networks," ACM p. 16-25 (Year: 2016).*

Rivera-Acosta, et al., "Automatic Tool for Fast Generation of Custom Convolutional Neural Networks Accelerators for FPGA", located on the internet: https://www.mdpi.com/2079-9292/8/6/641/htm.

Du, et al., "Optimizing of Convolutional Neural Network Accelerator", Green Electronics, Chapter 8, pp. 147-166, found on the internet: https://www.intechopen.com/books/green-electronics/optimizing-of-convolutional-neural-network-accelerator.

Ma, et al., "ALAMO: FPGA acceleration of deep learning algorithms with a modularized RTL compiler", Integration, the VLSI Journal 62 (2018), pp. 14-23, found on the internet: https://par.nsf.gov/servlets/purl/10087145.

Venieris, et al., "Toolflows for Mapping Convolutional Neural Networks on FPGAs:A Survey and Future Directions", ACM Computing Surveys, vol. 0, No. 0, Article 0, Mar. 2018; found on the internet: https://arxiv.org/pdf/1803.05900.pdf Song, "AI for AI: Automatically Generate Deep Neural Network Accelerator in FPGA for Data-center and Edge", IBM Research, China, 41 pages; found on the internet: http://xilinx.eetrend.com/system/files/2019-01/%E6%96%87%E7%AB%A0/private/100017371-58561-ai_dui_aizal_fpga_zhong_wei_shu_ju_zhong_xin_ji_duan_dian_zi_dong_sheng_cheng_shen_du_shen_jing_wang_luo_jia_s.

Wikipedia, "Stochastic gradient descent", 7 pages, found on the internet: https://en.wikipedia.org/wiki/Stochastic_gradient_descent.

* cited by examiner

HARDWARE ARCHITECTURE DETERMINATION BASED ON A NEURAL NETWORK AND A NETWORK COMPILATION PROCESS

BACKGROUND

The following relates generally to hardware acceleration, and more specifically to neural network hardware configuration.

Efficient and high-performing neural network processing is becoming important on devices such as computers, smartphones, tablets, and wearables. In some examples, devices may implement specialized hardware accelerators for performing specialized tasks with increased processing performance with reduced power consumption. For instance, multiple hardware accelerators may be chained together to form a computation graph for imaging and computer vision applications. Therefore, imaging and computer vision acceleration subsystems may be composed of multiple specialized hardware accelerators with an efficient streaming interconnect to transfer data between its hardware accelerators However, hardware architectures (e.g., configurations of hardware accelerators) are often designed manually, using previous information, intuition, and a trial-and-error approach. The amount of design decisions may be large and may take into account many design metrics such as memory size, memory form factor, number, topology of multipliers, etc. Thus, while manual design approaches may provide working solutions, they do not result in optimized hardware for specific uses across the wide space of configurable variables.

SUMMARY

A method, apparatus, non-transitory computer readable medium, and system for neural network hardware configuration are described. Embodiments of the method, apparatus, non-transitory computer readable medium, and system are configured to generate hardware configuration parameters for a neural network hardware accelerator based on hardware constraints and compiler constraints, compute a performance metric based on the hardware configuration parameters, power performance and area (PPA) constraints, and a representation of a neural network architecture, and update the hardware configuration parameters for the neural network architecture based on the performance metric.

A method, apparatus, non-transitory computer readable medium, and system for neural network hardware configuration are described. Embodiments of the method, apparatus, non-transitory computer readable medium, and system are configured to generate hardware configuration parameters for a neural network architecture based on hardware constraints, compile a representation of the neural network architecture to produce an instruction set for implementing the neural network architecture based on the hardware configuration parameters, simulate performance of the neural network architecture based on the hardware configuration parameters and the instruction set to produce a performance profile, compute a performance metric by weighting parameters of the performance profile based on PPA constraints, and update the hardware configuration parameters for the neural network architecture based on the performance metric.

An apparatus, system, and method for neural network hardware configuration are described. Embodiments of the apparatus, system, and method are configured to a decision making component configured to generate hardware configuration parameters for a neural network architecture based on hardware constraints and PPA constraints, a metrics computation component configured to compute a performance metric based on PPA constraints and a performance profile, a policy making component configured to compile an instruction set based on the hardware configuration parameters and a representation of a neural network architecture, and an emulator configured to produce a performance profile based on the hardware configuration parameters and the instruction set.

DETAILED DESCRIPTION

Figure 1:
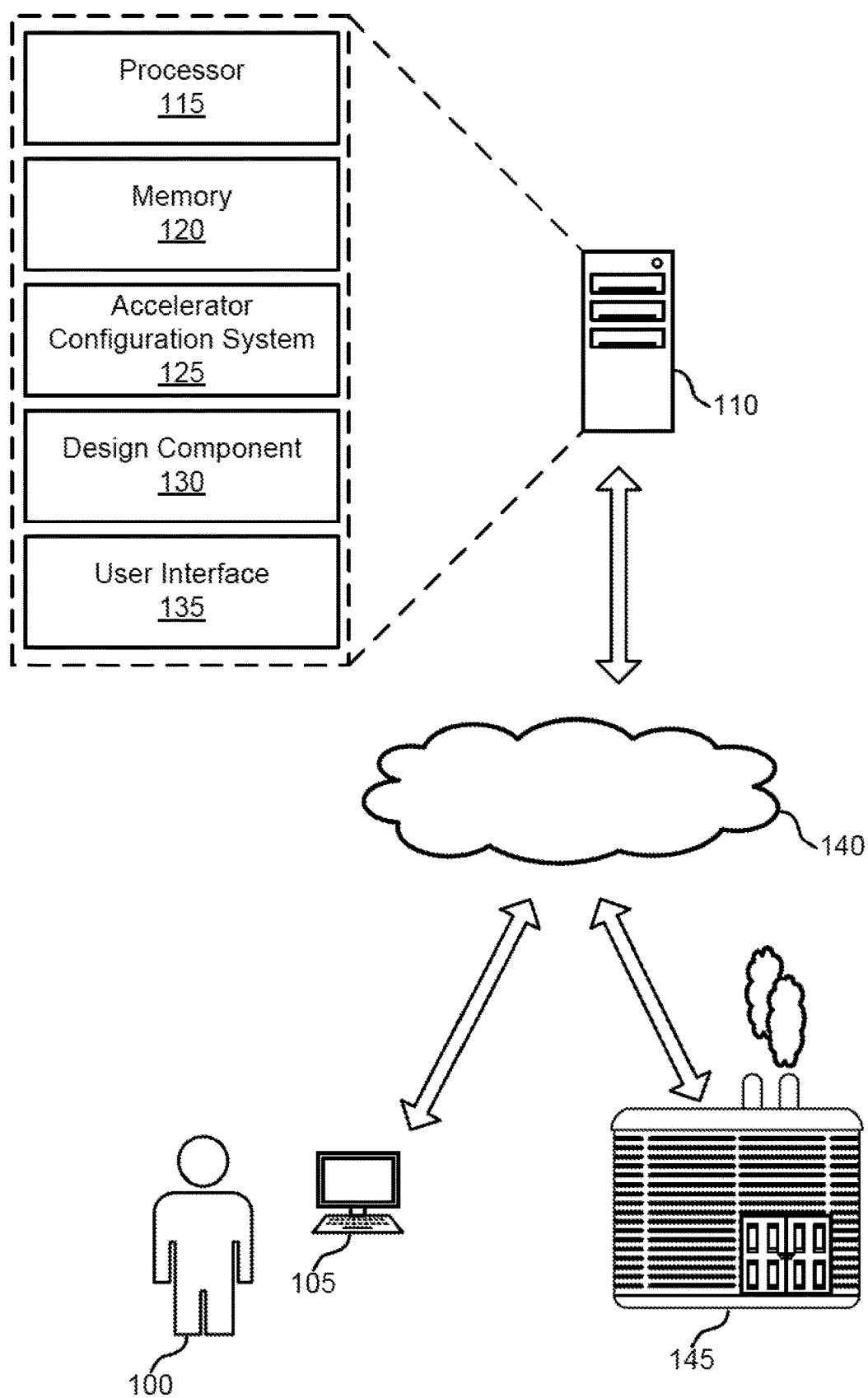
FIG. 1 shows an example of a system for neural network accelerator production according to aspects of the present disclosure.

Efficient and high-performing neural network processing is becoming important on devices such as computers, smartphones, tablets, and wearables. General computation units such as Computational Processor Units (CPUs), Graphical Processor Units (GPUs) and Neural Processor Units (NPUs) may perform tasks using specific hardware. A Specific Neural Processor (SNP) may be used for neural network processing, where the SNP may execute a specific network (e.g., a specific convolutional neural network (CNN), a specific artificial neural network (ANN), etc.) with high efficiency. In some examples, applications that are always powered on, with low power or low latency, may use SNP.

Hardware architectures (e.g., configurations of hardware accelerators) may be designed manually, using previous information, designer intuition, trial-and-error approaches, etc. In some cases, design decisions may be numerous and intensive and may consider design metrics such as memory size, memory form factor, number and topology of multipliers, etc. Manual design approaches may provide working solutions. However, such solutions may lack the ability to create variations for different users or use cases Embodiments of the present disclosure may provide for Hardware Architectures Search (HAS) techniques that may automate a process of hardware design using main applications (e.g., use cases) and a modeling heuristic of a compiler. Hardware may be designed based on the knowledge of the compiler for the hardware (e.g., firmware information and the compiler information may be used to optimize the hardware). Embodiments of the present disclosure consider the neural network's compilation process for multiple networks. A user may define performance constraints (e.g., area constraints, power constraints, performance constraints, accuracy degradation constraints, etc.) and the changes of compilation heuristics and hardware configuration parameters may be optimized to achieve the user defined performance constraints.

In some examples, an SNP may be designed, manufactured, etc. based on hardware configuration parameters identified according to the techniques described herein.

Hardware configuration parameters may be generated for a neural network hardware accelerator (e.g., for the SNP) based on hardware constraints (e.g., hardware performance constraints, hardware efficiency constraints, etc.) and compiler constraints. A performance profile (e.g., an SNP performance profile) may be computed based on the hardware configuration parameters, power performance and area (PPA) constraints (e.g., performance constraints defined by a user), and a representation of a neural network architecture (e.g., a CNN). The parameters of the performance profile may be summed to compute a performance metric. Hardware configuration parameters may be updated (e.g., iteratively) for the neural network architecture based on the computed performance metric for the instant hardware configuration parameters. Accordingly, hardware configuration parameters may be optimized based on the neural network's compilation process (e.g., actual compiler constraints) and optimization of PPA constraints (e.g., user defined performance constraints). SNP hardware may thus be designed based on the optimized hardware configuration parameters (e.g., via modeling heuristics of its compiler and main applications informed via user defined PPA constraints).

As an example, in the field of hardware acceleration for CNNs, the techniques described herein may provide a method for searching minimal points of pre-defined user performance constraints (e.g., in terms of PPA constraints). The method of the present disclosure considers the network compilation process and the one or more CNNs provided by the user. When generating the SNP, the user may define one or more use cases to be optimized by specifying PPA constraints. A performance metric (e.g., an evaluation metric) may then be computed based on the PPA constraints and the evaluated hardware configuration parameters. The described techniques may thus provide (e.g., output) a set of hardware configuration parameters that give the local minima of the computed performance metric. Accordingly, a neural network hardware accelerator (e.g., an SNP) may be designed or manufactured based on the designed set of hardware configuration parameters.

FIG. 1 shows an example of a system for neural network accelerator production according to aspects of the present disclosure. The example shown includes user 100, device 105, server 110, cloud 140, and factory 145. A user 100 may use a device 105 that may be in communication with a server 110. According to the techniques described herein, the system for neural network accelerator production shown in FIG. 1 may be implemented to design (e.g., via design component 130 of server 110) and manufacture (e.g., via factory 145) a neural network accelerator (e.g., an SNP) based on design metrics (e.g., based on PPA constraints from a user 100 via device 105).

User 100 is an example of, or includes aspects of, the corresponding element described with reference to FIG. 2. In some cases, a user 100 may include or refer to a designer, a customer, a project manager, etc. User 100 may utilize a device 105 to initiate and perform automated hardware design via HAS techniques described herein. In some cases a device 105 may include a computing device such as a personal computer, laptop computer, mainframe computer, palmtop computer, personal assistant, mobile device, or any other suitable processing apparatus.

A server 110 provides one or more functions to users 100 linked by way of one or more of the various networks. In some cases, the server 110 includes a single microprocessor board, which includes a microprocessor responsible for controlling all aspects of the server 110. In some cases, a server 110 uses microprocessor and protocols to exchange data with other devices 105/users 100 on one or more of the networks via hypertext transfer protocol (HTTP), and simple mail transfer protocol (SMTP), although other protocols such as file transfer protocol (FTP), and simple network management protocol (SNMP) may also be used. In some cases, a server 110 is configured to send and receive hypertext markup language (HTML) formatted files (e.g., for displaying web pages). In various embodiments, a server 110 comprises a general purpose computing device 105, a personal computer, a laptop computer, a mainframe computer, a super computer, or any other suitable processing apparatus.

Server 110 is an example of, or includes aspects of, the corresponding element described with reference to FIG. 2. In one embodiment, server 110 includes processor 115, memory 120, accelerator configuration system 125, design component 130, and user interface 135.

A processor 115 is an intelligent hardware device 105, (e.g., a general-purpose processing component, a digital signal processor (DSP), a CPU, a GPU, a microcontroller, an application specific integrated circuit (ASIC), a field programmable gate array (FPGA), a programmable logic device 105, a discrete gate or transistor logic component, a discrete hardware component, or any combination thereof). In some cases, the processor 115 is configured to operate a memory array using a memory controller. In other cases, a memory controller is integrated into the processor 115. In some cases, the processor 115 is configured to execute computer-readable instructions stored in a memory 120 to perform various functions. In some embodiments, a processor 115 includes special purpose components for modem processing, baseband processing, digital signal processing, or transmission processing.

Examples of a memory device (e.g., memory 120) include random access memory (RAM), read-only memory (ROM), or a hard disk. Examples of memory 120 include solid state memory and a hard disk drive. In some examples, memory 120 is used to store computer-readable, computer-executable software including instructions that, when executed, cause a processor 115 to perform various functions described herein. In some cases, the memory 120 contains, among other things, a BIOS which controls basic hardware or software operation such as the interaction with peripheral components or devices. In some cases, a memory controller operates memory cells. For example, the memory controller can include a row decoder, column decoder, or both. In some cases, memory cells within a memory 120 store information in the form of a logical state.

A CNN is a class of neural network that is commonly used in computer vision or image classification systems. In some cases, a CNN may enable processing of digital images with minimal pre-processing. A CNN may be characterized by the use of convolutional (or cross-correlational) hidden layers. These layers apply a convolution operation to the input before signaling the result to the next layer. Each convolutional node may process data for a limited field of input (i.e., the receptive field). During a forward pass of the CNN, filters at each layer may be convolved across the input volume, computing the dot product between the filter and the input. During the training process, the filters may be modified so that they activate when they detect a particular feature within the input.

An ANN is a hardware or a software component that includes a number of connected nodes (i.e., artificial neurons), which loosely correspond to the neurons in a human brain. Each connection, or edge, transmits a signal from one node to another (like the physical synapses in a brain). When a node receives a signal, it processes the signal and then transmit the processed signal to other connected nodes. In some cases, the signals between nodes comprise real numbers, and the output of each node is computed by a function of the sum of its inputs. Each node and edge are associated with one or more node weights that determine how the signal is processed and transmitted. During the training process, these weights are adjusted to improve the accuracy of the result (i.e., by minimizing a loss function which corresponds in some way to the difference between the current result and the target result). The weight of an edge increases or decreases the strength of the signal transmitted between nodes. In some cases, nodes have a threshold below which a signal is not transmitted at all. In some examples, the nodes are aggregated into layers. Different layers perform different transformations on their inputs. The initial layer is known as the input layer and the last layer is known as the output layer. In some cases, signals traverse certain layers multiple times.

A specific neural processor (SNP) may include or refer to a microprocessor that specializes in the acceleration of machine learning algorithms. For example, an SNP may operate on models such as CNNs. In some cases, an SNP may operate on predictive models such as ANNs or random forests (RFs). In some cases, an SNP is designed in a way that makes it unsuitable for general purpose computing such as that performed by a CPU. Additionally or alternatively, the software support for an SNP may not be developed for general purpose computing.

A cloud 140 is a computer network configured to provide on-demand availability of computer system resources, such as data storage and computing power. In some examples, the cloud 140 provides resources without active management by the user 100. The term cloud 140 is sometimes used to describe data centers available to many users 100 over the Internet. Some large cloud 140 networks have functions distributed over multiple locations from central servers 110. A server 110 is designated an edge server 110 if it has a direct or close connection to a user 100. In some cases, a cloud 140 is limited to a single organization. In other examples, the cloud 140 is available to many organizations. In one example, a cloud 140 includes a multi-layer communications network comprising multiple edge routers and core routers. In another example, a cloud 140 is based on a local collection of switches in a single physical location.

According to some embodiments, accelerator configuration system 125 iterates between computing a performance metric (e.g., for evaluated hardware configuration parameters based on PPA constraints) and updating the hardware configuration parameters to produce final hardware configuration parameters. In some examples, the iterating is based on simulated annealing. In some examples, the iterating is based on stochastic gradient descent. According to some embodiments, accelerator configuration system 125 updates the hardware configuration parameters for the neural network architecture based on the performance metric. In some examples, the hardware configuration parameters are generated based on compiler constraints, and the instruction set is compiled based on the compiler constraints. Accelerator configuration system 125 is an example of, or includes aspects of, the corresponding element described with reference to FIG. 3.

According to some embodiments, design component 130 generates a register-transfer level (RTL) design for the neural network architecture based on the hardware configuration parameters. In some examples, design component 130 manufactures an SNP based on the hardware configuration parameters. According to some embodiments, design component 130 may be configured to design an SNP based on the hardware configuration parameters.

According to some embodiments, user interface 135 prompts a user 100 to identify the PPA constraints. In some examples, user interface 135 receives the PPA constraints from the user 100 based on the prompting. According to some embodiments, user interface 135 may be configured to receive the PPA constraints from a user 100. A user interface 135 may enable a user 100 to interact with a device 105 and/or a server 110. In some embodiments, the user interface 135 may include an audio device, such as an external speaker system, an external display device such as a display screen, or an input device (e.g., remote control device interfaced with the user interface directly or through an input/output (IO) controller module). In some cases, a user interface may be a graphical user interface (GUI). A user interface 135 may be included as part of a device 105, a server 110, or both.

Factory 145 is an example of, or includes aspects of, the corresponding element described with reference to FIG. 2. A factory 145 may include any industrial site and may include various buildings and machinery where workers and machines may manufacture and process items (e.g., such as hardware, neural network accelerator hardware, SNPs, etc.). In some cases, a factory 145 may include or refer to a manufacturing plant, a production plant, a fabrication facility, etc.

As described in more detail herein (e.g., with reference to FIG. 3), accelerator configuration system 125 may determine hardware configuration parameters for designing a neural network hardware accelerator (e.g., an SNP) optimized for certain use cases via compiler and neural network (e.g., CNN) awareness. For example, when generating (e.g., designing) a neural network hardware accelerator (e.g., an SNP), user 100 (e.g., a designer) may define which use cases are to be optimized by specifying performance constraints. For instance, PPA constraints, which networks are supported, latency and power performance constraints and weighting of such performance constraints, relative weight between different networks, total area and other limitations, etc. may be specified. Performance metrics may then be computed based on the user defined performance constraints and the different hardware configuration parameters evaluated, and the HAS techniques described herein may minimize the score of the performance metric that involves PPA (e.g., via simulated annealing, stochastic gradient descent, etc.). Simulated annealing may refer to a probabilistic technique for approximating the global optimum of a given function. Stochastic gradient descent techniques may refer to an iterative method for optimizing an objective function with suitable smoothness properties.

Figure 2:
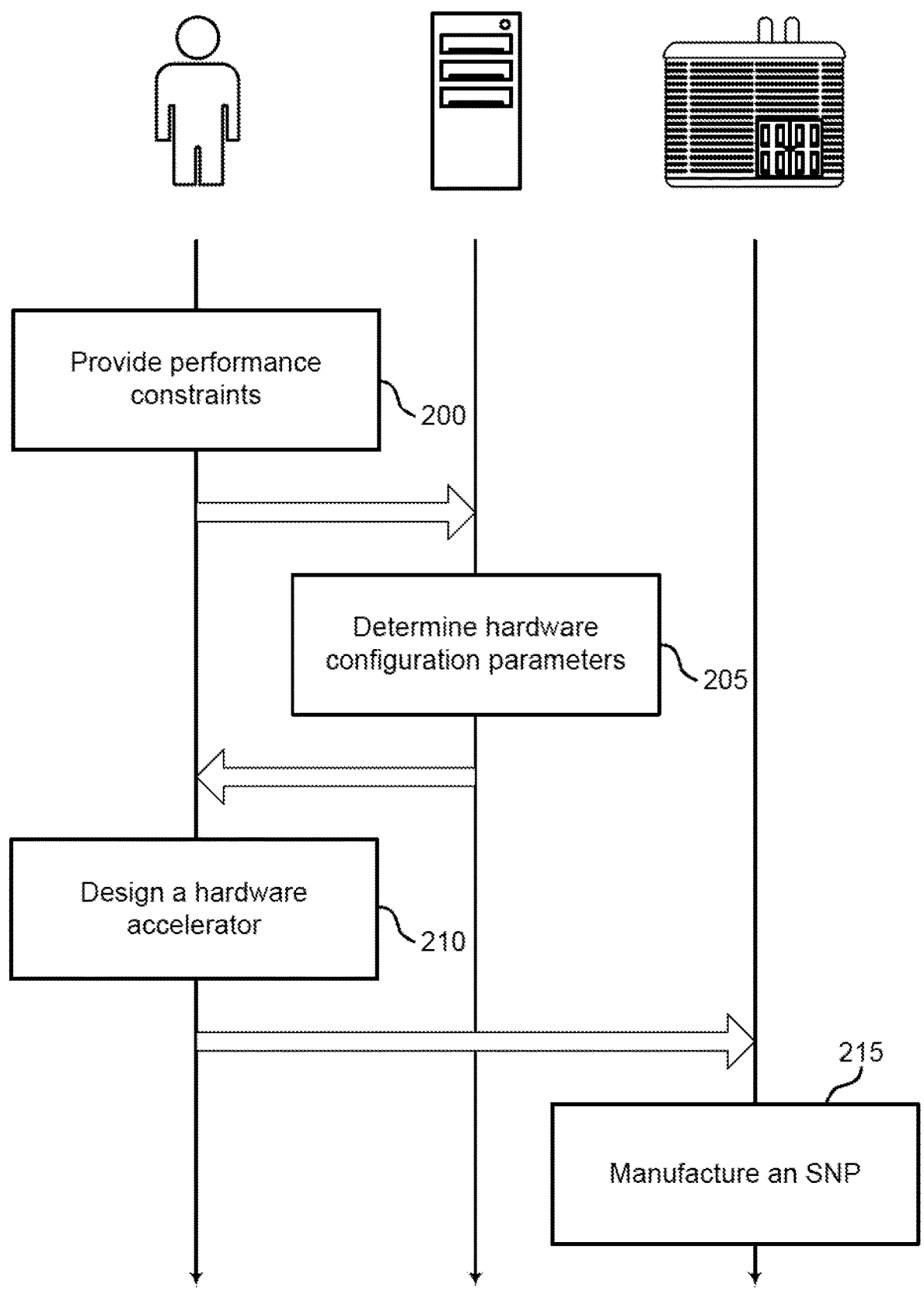
FIG. 2 shows an example of a process for producing a neural network accelerator according to aspects of the present disclosure.

FIG. 2 shows an example of a process for producing a neural network accelerator according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

At operation 200, the user provides PPA constraints. For example, the user may provide hard constraints on power, performance, or chip size, as well as weights indicating how important each of these variables are for final chip design. In some cases, the operations of this step refer to, or may be performed by, a user as described with reference to FIGS. 1 and 2.

At operation 205, the system determines hardware configuration parameters based on the PPA constraints from the user. For example, the hardware configuration parameters may be determined by an accelerator configuration system as described in FIGS. 1 and 3. In some cases, the operations of this step refer to, or may be performed by, a server as described with reference to FIGS. 1 and 2.

At operation 210, the user designs a hardware accelerator based on the hardware configuration parameters determined by the server. For example, a user my generate an RTL design for the neural network architecture based on the hardware configuration parameters. In some cases, the operations of this step refer to, or may be performed by, a user as described with reference to FIGS. 1 and 2.

At operation 215, the system manufactures an SNP based on the design from the user. For example, a semiconductor fabrication facility may manufacture the SNP based on the RTL design provided by the user. In some cases, the operations of this step refer to, or may be performed by, a factory as described with reference to FIGS. 1 and 2.

Figure 3:
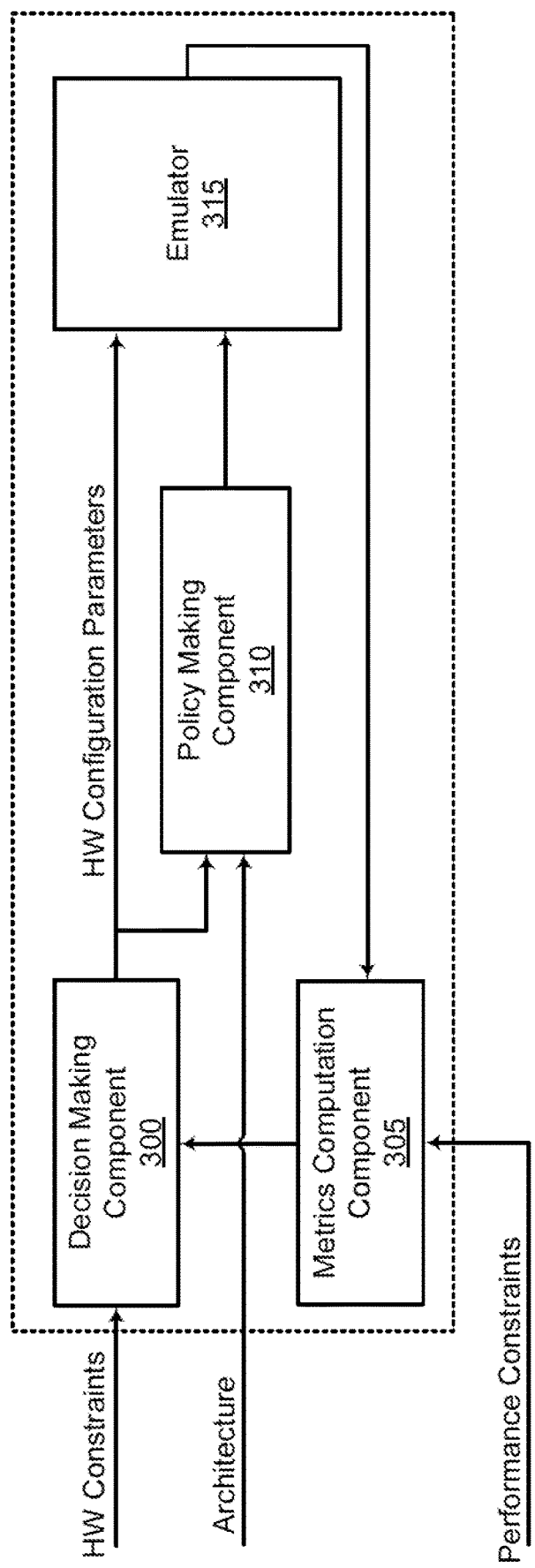
FIG. 3 shows an example of an accelerator configuration system according to aspects of the present disclosure.

FIG. 3 shows an example of an accelerator configuration system according to aspects of the present disclosure. The example accelerator configuration system 340 includes decision making component 300, metrics computation component 305, policy making component 310, and emulator 315. For instance, a server may include a memory, processor, design component, user interface, and accelerator configuration system. In some cases, the memory, processor, design component, user interface, and accelerator configuration system may be examples of the corresponding devices as described with reference to FIG. 1.

According to the techniques described herein, a hardware architecture (e.g., of a neural network hardware accelerator, an SNP, etc.) may be efficiently designed (e.g., and created, manufactured, etc.) based on customer (e.g., user) performance constraints (e.g., such as PPA constraints). In some cases, performance constraints may be represented by, for example, five attributes including neural network performance (e.g., network accuracy), hardware performance (e.g., run time and latency), hardware energy consumption (e.g., average power), hardware area cost, and memory (e.g., dynamic random-access memory (DRAM)) bandwidth consumption. Any or all of such attributes may be prioritized by setting a corresponding weight for the attribute. For instance, hardware performance, hardware energy consumption, hardware area cost, and memory bandwidth consumption may each be prioritized based on setting a weight. While setting a limit (e.g., a hard limit) for each attribute may be used for metric computation. Accordingly, user defined performance constraints (e.g., such as PPA constraints) may include or refer to the combination of a limit or target for each attribute (e.g., each performance constraint) as well as a weight for each attribute (e.g., each performance constraint).

For instance, when generating an SNP, a designer (e.g., a user, a project manager, etc.) may define which use cases (e.g., such as image recognition, face detection, facial recognition, etc.) are optimized by specifying performance constraints (e.g., or evaluation metrics). CNNs may be associated with supported networks, latency and power limitations, and weights (e.g., as well as relative weight between different networks). Total area and other limitations (e.g., access to external cache, the fabrication process, etc.) may also be taken into account. Customer targets may include a set of limits and tradeoffs for a single CNN or multiple CNNs. Targets (e.g., performance constraints) may be associated with relevant weights based on the prioritization (e.g., or importance) of the performance constraints. For example, Table 1 shows example performance constraints and associated targets and weights for each performance constraint.

TABLE 1

| Performance constraints | Target | Weight |
| --- | --- | --- |
| Area [Gates] | 3 [MG] | 5 |
| Power [mW] | 20 [mW] | 1 |
| Performance [mSec] | 33 [mSec] | 0 |
| Accuracy Degradation [%] | 3% | 10 |

In some examples, the weights of performance constraints may prioritize further optimization of the performance constraints beyond the target associated with each performance constraint. For instance, referring to the example Table 1, a neural network hardware accelerator (e.g., an SNP) may be designed based on hardware configuration parameters that satisfy area, power, performance, and accuracy degradation targets and optimize accuracy degradation and area performance constraints beyond their respective targets (e.g., due to the weighting of the optimize accuracy degradation and area performance constraints relative to the other performance constraints).

In some examples, the hardware model metric score per neural network (e.g., the performance metric or the evaluation metric) may be calculated according the parameters of the performance profile (e.g., the PPA results) in the following manner:

$$r \overset{\Delta}{=} \begin{cases} s/\text{limit} & s \in \{\text{Area, Power, Accuracy}\} \\ s \cdot \text{limit} & s \in \{\text{Performance}\} \end{cases} \quad (1)$$

$$M_i(r) = 1 + weight_i \cdot r + e^{10 \cdot (r-1)} \quad (2)$$

$$M_{tot} = \sum M_i \quad (3)$$

The weighted parameters of the performance profile may be summed and may be computed as a single score (e.g., as a single performance metric, $M_{tot}$). Accordingly, a decision making component 300 may receive hardware (HW) constraints and may output a set of hardware (HW) configuration parameters. Policy making component 310 compiles the representation of the neural network architecture (e.g., the CNN) to produce a representation of an instruction set for implementing the neural network architecture based on the hardware configuration parameters and the compiler constraints. Accordingly, the emulator 315 may simulate performance of the neural network architecture based on the hardware configuration parameters and the representation of the instruction set. The emulator 315 may then produce a performance profile.

A user may input performance constraints (e.g., PPA constraints) and a metrics computation component 305 may compute a score (e.g., a performance metric) based on the performance constraints and the performance profile. Accordingly, the metrics computation component 305 may output the performance metric to the decision making component 300, and the decision making component 300 may use the performance metric to update hardware configuration parameters for additional evaluations of different combinations of hardware configuration parameters (e.g., to ultimately optimize hardware configuration parameters by improving/minimizing computed performance metrics). For instance, based on the performance metric, the design making component may add multipliers for speed, remove memory to reduce area, etc. based on performance metrics computed from produced performance profiles and user input performance constraints.

A decision making component 300 may be used to generate hardware configurations with optimization algorithms. The decision making component 300 may decide which hardware configuration parameters may be changed, along with the amplitude (e.g., the extent) of the change, while minimizing a pre-defined metric score.

A metrics computation component 305 may compute unified weighted metrics to influence decisions of the decision making component 300. For instance, the metrics computation component 305 may take performance constraints as input from a user (e.g., as well as any weighting of attributes of the performance constraints) and may output a single score that may be used by the decision making component for updating of any hardware configuration parameters. In some cases, the metrics computation component 305 may include or refer to a Metrics Computation Unit (MCU).

A policy making component 310 (e.g., an SNP policy maker) may be used for parsing a neural network into components that can be executed on SNP hardware. An emulator 315 (e.g., an SNP emulator) may include, implement, or refer to hardware emulation software that emulates algorithm performance, power consumption, DRAM bandwidth, and hardware area in terms of logic gates. The policy making component 310 may output an intermediate configuration including a network graph+instructions to perform each operation.

Such HAS techniques may be performed iteratively and may use techniques for approximating global optima of a function. For example, a variation of a simulated annealing optimization (SAO) or differential optimization used to find an optimized hardware configuration may be implemented (e.g., iteratively). In some cases, it may take more than one iteration for the exploration (e.g., the HAS) to converge. In some cases, a few similar results (e.g., a few combinations of hardware configuration parameters) may be provided and a customer or designer may decide which option to choose (e.g., based on metrics associated with each of the few combinations of hardware configuration parameters). In some cases, HAS techniques performed iteratively may be referred to as exploration, where exploration may converge to a solution via iteratively updating hardware configuration parameters.

While optimizing the performance constraints (e.g., the user defined performance constraints or the user defined PPA requirements), embodiments of the present disclosure change hardware configuration parameters using a variable hardware and compiler design to support multiple parameters (e.g., multiple hardware configuration parameters) for a hardware search. The search uses the actual compilation and policy to estimate the PPA (e.g., the performance profile) prior to fabrication and to adjust the hardware configuration parameters to minimize the performance metric (e.g., that is computed based on parameters of the performance profile). A hardware model and instruction set are output to define an optimized hardware based on user defined performance constraints.

Embodiments of the present disclosure are configured to automatically determine hardware configuration parameters while searching a set of parameters while being aware of the actual hardware operation post compilation and of the hardware performance and physical attributes. Embodiments of the present disclosure may be used to find hardware for various applications or use cases (e.g., such as face detection). The techniques described herein may provide for increased performance (e.g., compared to methods without leveraging compiler knowledge and automated HAS techniques).

According to the techniques described herein, HAS schemes may search several (e.g., dozens) of hardware hyper parameters (e.g., via an evolutionary algorithm). Candidates (e.g., combinations of hardware configuration parameters) may be pruned (e.g., based on area and ideal latency) and parallel generation, computation, and evaluation may be performed. The described techniques may support a fast compilation mode and fast emulation (e.g., using symmetries in complied graphs). In some cases, to converge a genetic algorithm, hyper parameters (e.g., Gen2 hyper parameters) may be set to be independent (e.g., as possible). As an example, Table 2 shows example hardware configuration parameters that may be implemented and evaluated in described HAS schemes.

TABLE 2

| # | HW Configuration Parameter | Description | Range |
|---|---|---|---|
| 1 | Total multipliers | mac number | 1-4096 |
| 2 | Total memory (in bits) | Total SRAM size | 1K-8M |
| 3 | Clusters | Input channel parallelism | 1-4 |
| 4 | Arrays | Output channels parallelism | 1-16 |
| 5 | PCU ratio | Activation units fraction (from macs) | 1-10 |
| 6 | Memory Banks granularity | Effects memory usage flexibility | 1-3 |
| 7 | Copy Memory BW (AXI) | For DRAM/SRAM or SRAM/SRAM transactions | 64/128/256 |
| 8 | FM memory BW multiplier (a_o_width) | For compute FM load/store | 0-5 |
| 9 | W memory BW multiplier (w_width) | For compute weights read | 0-3 |

In some examples, exploration (e.g., iteration of HAS techniques described herein) may translate between hardware parameters and exploration parameters to better fit a genetic algorithm (e.g., as there may be less cross-correlation and smoother changes). In some cases, coordinates may be changed such that exploration may have a more direct impact on score (e.g., performance metric). For example, coordinates may be changed from cartesian coordinate system to a spherical/polar coordinate system.

According to some embodiments, decision making component 300 generates hardware configuration parameters for a neural network hardware accelerator based on hardware constraints and compiler constraints (e.g., constraints on the output of the policy making component 310, design restriction or limitations based on the compiler, etc.). In some examples, decision making component 300 updates the hardware configuration parameters for the neural network architecture based on the performance metric. In some examples, the neural network architecture includes a CNN. In some examples, the neural network architecture is configured to facial recognition tasks. In some examples, the hardware configuration parameters include one or more memory sizes, one or more memory form factors, a number of multipliers, a topology of multipliers, or any combination thereof. In some examples, decision making component 300 selects the hardware configuration parameters to be optimized based on the neural network architecture.

According to some embodiments, decision making component 300 generates hardware configuration parameters for a neural network architecture based on hardware constraints. According to some embodiments, decision making component 300 may be configured to generate hardware configuration parameters for a neural network architecture based on hardware constraints and PPA constraints. In some examples, the decision making component 300 takes compiler constraints corresponding to the policy making component 310 as input.

According to some embodiments, metrics computation component 305 computes a performance metric based on the hardware configuration parameters, PPA constraints, and a representation of the neural network architecture. In some examples, metrics computation component 305 multiplies each parameter of the performance profile by a weight based on the PPA constraints to compute the performance metric. In some examples, metrics computation component 305 computes a sum of the performance metrics, where the hardware configuration parameters are updated based on the sum. In other words, metrics computation component 305 may combine or sum aspects of the performance profile (e.g., via techniques described with reference to Equations 1-3) to compute a performance metric. According to some embodiments, metrics computation component 305 computes a performance metric by weighting parameters of the performance profile based on PPA constraints. According to some embodiments, metrics computation component 305 may be configured to compute a performance metric based on PPA constraints and a performance profile.

According to some embodiments, policy making component 310 compiles the representation of the neural network architecture to produce a representation of an instruction set for implementing the neural network architecture based on the hardware configuration parameters and the compiler constraints. According to some embodiments, policy making component 310 compiles a representation of the neural network architecture to produce an instruction set for implementing the neural network architecture based on the hardware configuration parameters. According to some embodiments, policy making component 310 may be configured to compile an instruction set based on the hardware configuration parameters and a representation of a neural network architecture.

According to some embodiments, emulator 315 simulates performance of the neural network architecture based on the hardware configuration parameters and the representation of the instruction set to produce a performance profile, where the performance metric is computed based on the performance profile. In some examples, the performance profile includes two or more parameters from a set including algorithm performance, power consumption, memory bandwidth, and chip area. According to some embodiments, emulator 315 simulates performance of the neural network architecture based on the hardware configuration parameters and the instruction set to produce a performance profile. According to some embodiments, emulator 315 may be configured to produce a performance profile based on the hardware configuration parameters and the instruction set.

Figure 4:
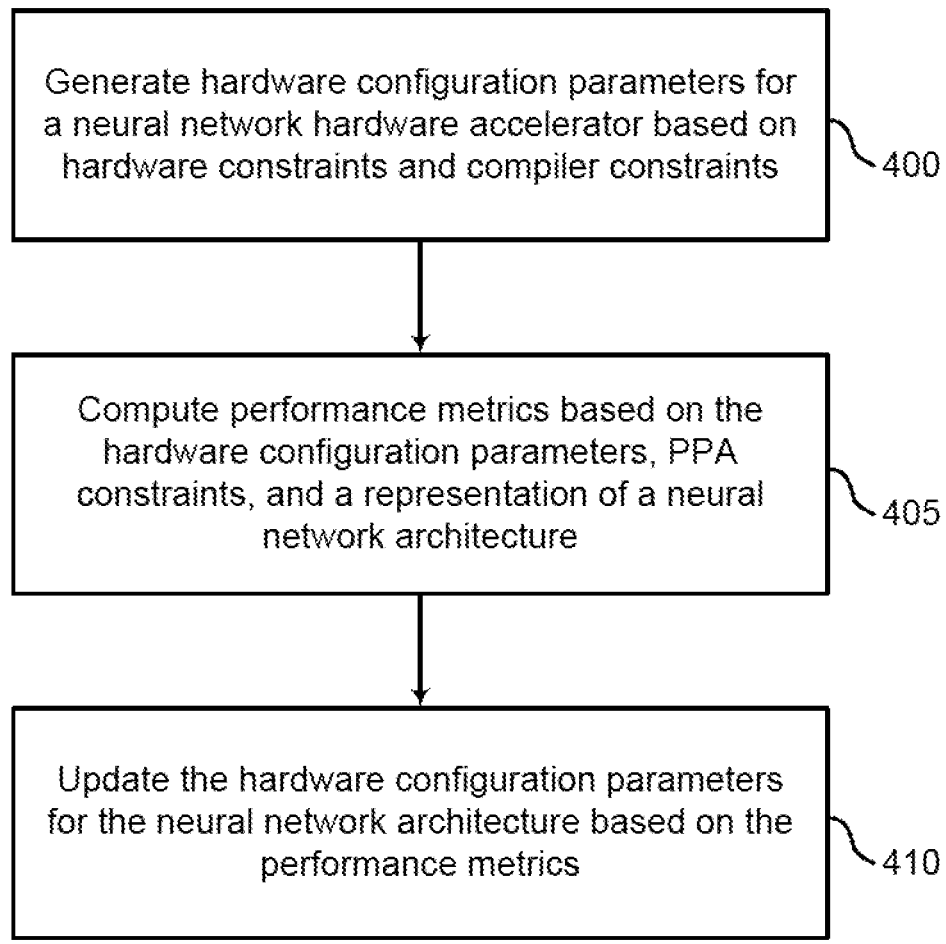
FIGS. 4 through 6 show examples of a process for neural network hardware configuration according to aspects of the present disclosure.

FIG. 4 shows an example of a process for neural network hardware configuration according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

At operation 400, the system generates hardware configuration parameters for a neural network hardware accelerator based on hardware constraints and compiler constraints. In some cases, the operations of this step refer to, or may be performed by, a decision making component as described with reference to FIG. 3.

At operation 405, the system computes a performance metric based on the hardware configuration parameters, PPA constraints, and a representation of a neural network architecture. In some cases, the operations of this step refer to, or may be performed by, a metrics computation component as described with reference to FIG. 3.

At operation 410, the system updates the hardware configuration parameters for the neural network architecture based on the performance metric. In some cases, the operations of this step refer to, or may be performed by, an accelerator configuration system as described with reference to FIG. 1.

Figure 5:
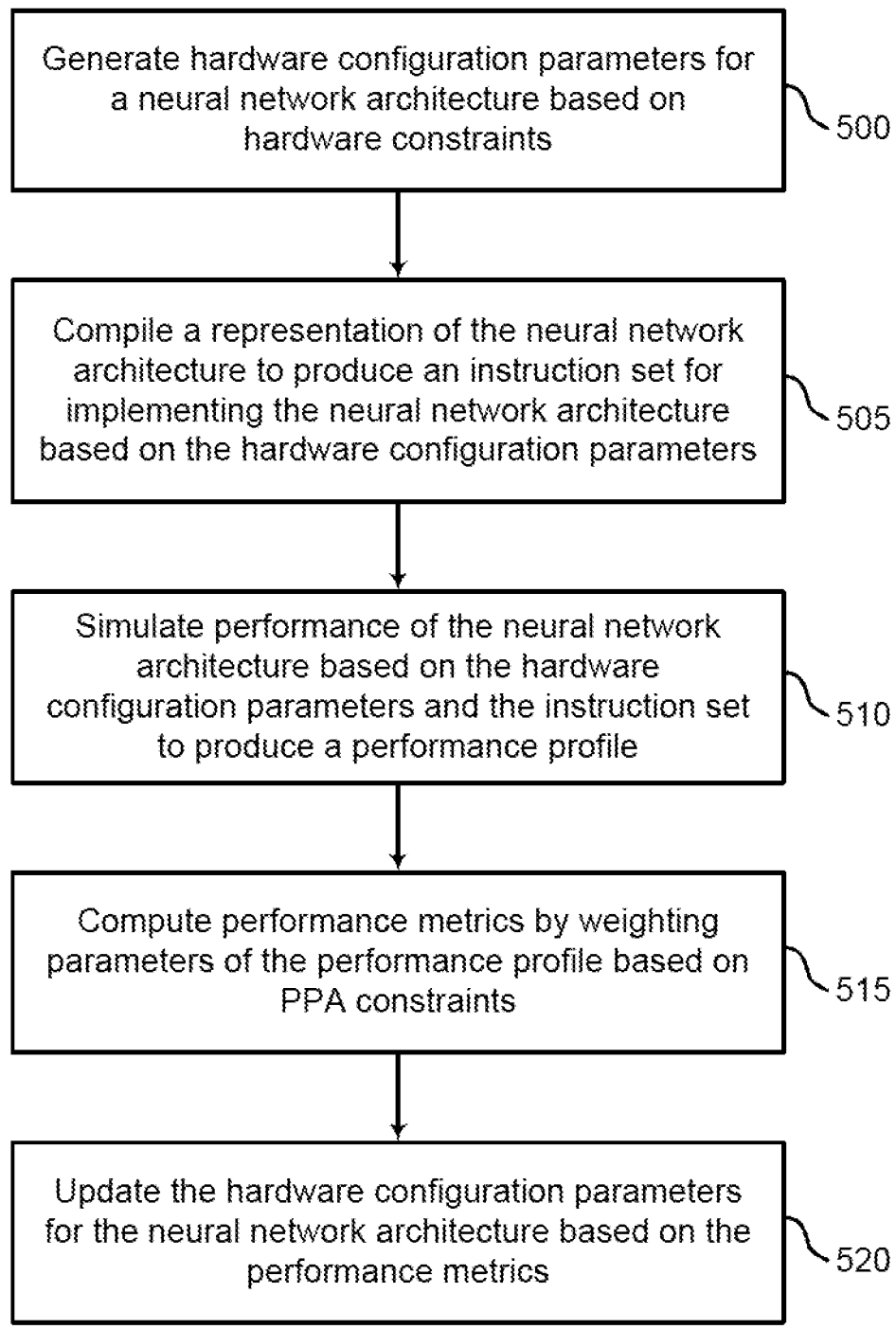

FIG. 5 shows an example of a process for neural network hardware configuration according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

At operation 500, the system generates hardware configuration parameters for a neural network architecture based on hardware constraints. In some cases, the operations of this step refer to, or may be performed by, a decision making component as described with reference to FIG. 3.

At operation 505, the system compiles a representation of the neural network architecture to produce an instruction set for implementing the neural network architecture based on the hardware configuration parameters. In some cases, the operations of this step refer to, or may be performed by, a policy making component as described with reference to FIG. 3.

At operation 510, the system simulates performance of the neural network architecture based on the hardware configuration parameters and the instruction set to produce a performance profile. In some cases, the operations of this step refer to, or may be performed by, an emulator as described with reference to FIG. 3.

At operation 515, the system computes a performance metric by weighting parameters of the performance profile based on PPA constraints. In some cases, the operations of this step refer to, or may be performed by, a metrics computation component as described with reference to FIG. 3.

At operation 520, the system updates the hardware configuration parameters for the neural network architecture based on the performance metric. In some cases, the operations of this step refer to, or may be performed by, an accelerator configuration system as described with reference to FIG. 1.

Figure 6:
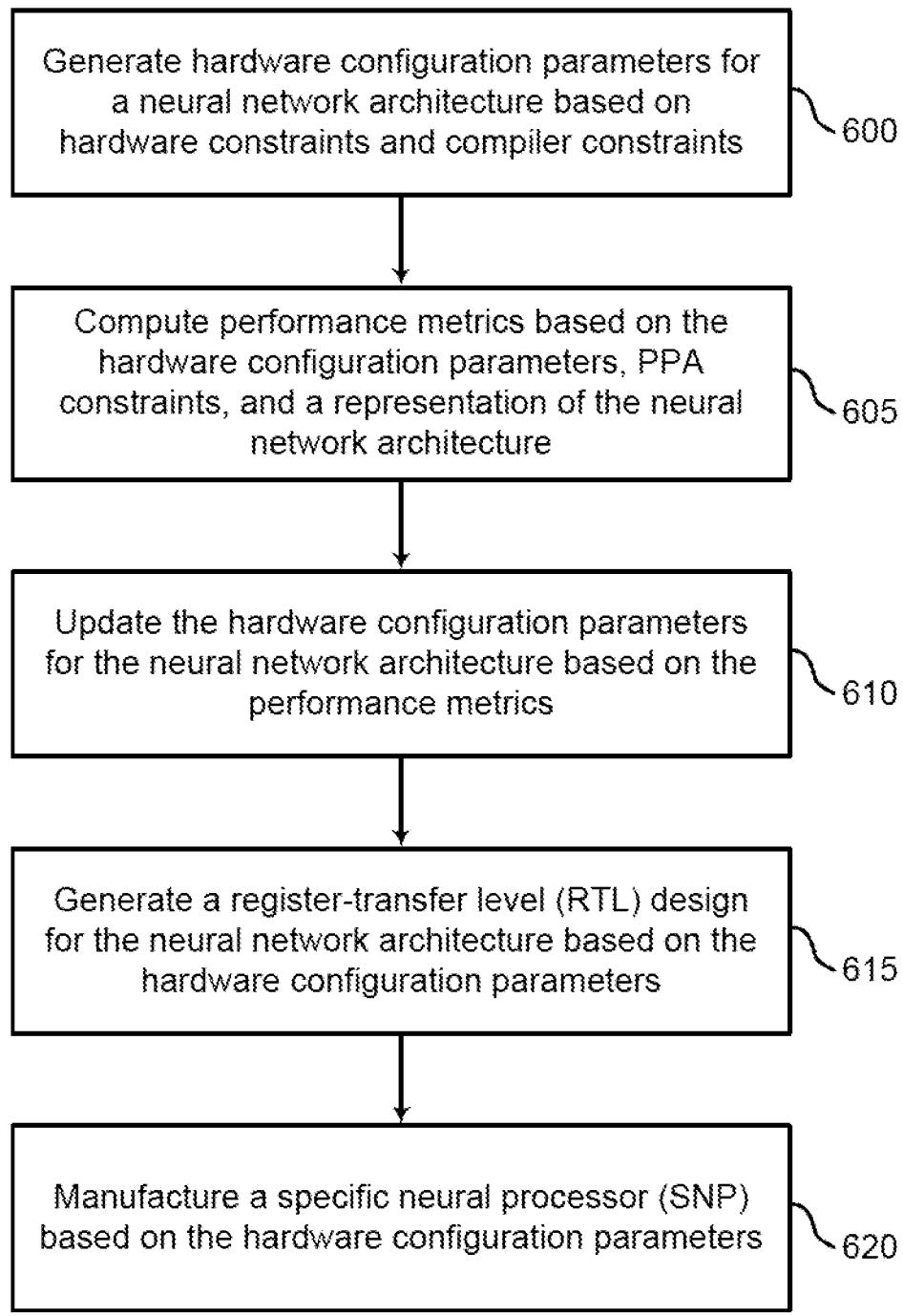

FIG. 6 shows an example of a process for neural network hardware configuration according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

At operation 600, the system generates hardware configuration parameters for a neural network architecture based on hardware constraints and compiler constraints. In some cases, the operations of this step refer to, or may be performed by, a decision making component as described with reference to FIG. 3.

At operation 605, the system computes a performance metric based on the hardware configuration parameters, PPA constraints, and a representation of the neural network architecture. In some cases, the operations of this step refer to, or may be performed by, a metrics computation component as described with reference to FIG. 3.

At operation 610, the system updates the hardware configuration parameters for the neural network architecture based on the performance metric. In some cases, the operations of this step refer to, or may be performed by, an accelerator configuration system as described with reference to FIG. 1.

At operation 615, the system generates a RTL design for the neural network architecture based on the hardware configuration parameters. In some cases, the operations of this step refer to, or may be performed by, a design component as described with reference to FIG. 1.

At operation 620, the system manufactures an SNP based on the hardware configuration parameters. In some cases, the operations of this step refer to, or may be performed by, a design component as described with reference to FIG. 1.

Accordingly, the present disclosure includes the following embodiments.

A method for neural network hardware configuration is described. Embodiments of the method are configured to generating hardware configuration parameters for a neural network hardware accelerator based on hardware constraints and compiler constraints, computing a performance metric based on the hardware configuration parameters, PPA constraints, and a representation of a neural network architecture, and updating the hardware configuration parameters for the neural network architecture based on the performance metric.

An apparatus for neural network hardware configuration is described. The apparatus includes a processor, memory in electronic communication with the processor, and instructions stored in the memory. The instructions are operable to cause the processor to generate hardware configuration parameters for a neural network hardware accelerator based on hardware constraints and compiler constraints, compute a performance metric based on the hardware configuration parameters, PPA constraints, and a representation of a neural network architecture, and update the hardware configuration parameters for the neural network architecture based on the performance metric.

A non-transitory computer readable medium storing code for neural network hardware configuration is described. In some examples, the code comprises instructions executable by a processor to: generate hardware configuration parameters for a neural network hardware accelerator based on hardware constraints and compiler constraints, compute a performance metric based on the hardware configuration parameters, PPA constraints, and a representation of a neural network architecture, and update the hardware configuration parameters for the neural network architecture based on the performance metric.

A system for neural network hardware configuration is described. Embodiments of the system are configured to generating hardware configuration parameters for a neural network hardware accelerator based on hardware constraints and compiler constraints, computing a performance metric based on the hardware configuration parameters, PPA constraints, and a representation of a neural network architecture, and updating the hardware configuration parameters for the neural network architecture based on the performance metric.

Some examples of the method, apparatus, non-transitory computer readable medium, and system described above further include compiling the representation of the neural network architecture to produce a representation of an instruction set for implementing the neural network architecture based on the hardware configuration parameters and the compiler constraints. Some examples further include simulating performance of the neural network architecture based on the hardware configuration parameters and the representation of the instruction set to produce a performance profile, wherein the performance metric is computed based on the performance profile. In some examples, the performance profile includes two or more parameters from a set comprising algorithm performance, power consumption, memory bandwidth, and chip area.

Some examples of the method, apparatus, non-transitory computer readable medium, and system described above further include multiplying each parameter of the performance profile by a weight based on the PPA constraints to compute the performance metric. Some examples further include computing a sum of the performance profile parameters, wherein the hardware configuration parameters are updated based on the sum.

Some examples of the method, apparatus, non-transitory computer readable medium, and system described above further include iterating between computing the performance metric and updating the hardware configuration to produce final hardware configuration parameters. In some examples, the iterating is based on simulated annealing. In some examples, the iterating is based on stochastic gradient descent. Some examples of the method, apparatus, non-transitory computer readable medium, and system described above further include prompting a user to identify the PPA constraints. Some examples further include receiving the PPA constraints from the user based on the prompting.

Some examples of the method, apparatus, non-transitory computer readable medium, and system described above further include generating a RTL design for the neural network architecture based on the hardware configuration parameters. Some examples of the method, apparatus, non-transitory computer readable medium, and system described above further include manufacturing an SNP based on the hardware configuration parameters. In some examples, the neural network architecture comprises a CNN. In some examples, the neural network architecture is configured to facial recognition tasks.

In some examples, the hardware configuration parameters include one or more memory sizes, one or more memory form factors, a number of multipliers, a topology of multipliers, or any combination thereof. Some examples of the method, apparatus, non-transitory computer readable medium, and system described above further include selecting the hardware configuration parameters to be optimized based on the neural network architecture.

A method for neural network hardware configuration is described. Embodiments of the method are configured to generating hardware configuration parameters for a neural network architecture based on hardware constraints, compiling a representation of the neural network architecture to produce an instruction set for implementing the neural network architecture based on the hardware configuration parameters, simulating performance of the neural network architecture based on the hardware configuration parameters and the instruction set to produce a performance profile, computing a performance metric by weighting parameters of the performance profile based on PPA constraints, and updating the hardware configuration parameters for the neural network architecture based on the performance metric.

An apparatus for neural network hardware configuration is described. The apparatus includes a processor, memory in electronic communication with the processor, and instructions stored in the memory. The instructions are operable to cause the processor to generate hardware configuration parameters for a neural network architecture based on hardware constraints, compile a representation of the neural network architecture to produce an instruction set for implementing the neural network architecture based on the hardware configuration parameters, simulate performance of the neural network architecture based on the hardware configuration parameters and the instruction set to produce a performance profile, compute a performance metric by weighting parameters of the performance profile based on PPA constraints, and update the hardware configuration parameters for the neural network architecture based on the performance metric.

A non-transitory computer readable medium storing code for neural network hardware configuration is described. In some examples, the code comprises instructions executable by a processor to: generate hardware configuration parameters for a neural network architecture based on hardware constraints, compile a representation of the neural network architecture to produce an instruction set for implementing the neural network architecture based on the hardware configuration parameters, simulate performance of the neural network architecture based on the hardware configuration parameters and the instruction set to produce a performance profile, compute a performance metric by weighting parameters of the performance profile based on PPA constraints, and update the hardware configuration parameters for the neural network architecture based on the performance metric.

A system for neural network hardware configuration is described. Embodiments of the system are configured to generating hardware configuration parameters for a neural network architecture based on hardware constraints, compiling a representation of the neural network architecture to produce an instruction set for implementing the neural network architecture based on the hardware configuration parameters, simulating performance of the neural network architecture based on the hardware configuration parameters and the instruction set to produce a performance profile, computing a performance metric by weighting parameters of the performance profile based on PPA constraints, and updating the hardware configuration parameters for the neural network architecture based on the performance metric. In some examples, the hardware configuration parameters are generated based on compiler constraints, and the instruction set is compiled based on the compiler constraints.

An apparatus for neural network hardware configuration is described. Embodiments of the apparatus are configured to a decision making component configured to generate hardware configuration parameters for a neural network architecture based on hardware constraints and PPA constraints, a metrics computation component configured to compute a performance metric based on PPA constraints and a performance profile, a policy making component configured to compile an instruction set based on the hardware configuration parameters and a representation of a neural network architecture, and an emulator configured to produce a performance profile based on the hardware configuration parameters and the instruction set.

A system for neural network hardware configuration is described. The system includes a decision making component configured to generate hardware configuration parameters for a neural network architecture based on hardware constraints and PPA constraints, a metrics computation component configured to compute a performance metric based on PPA constraints and a performance profile, a policy making component configured to compile an instruction set based on the hardware configuration parameters and a representation of a neural network architecture, and an emulator configured to produce a performance profile based on the hardware configuration parameters and the instruction set.

A method of manufacturing an apparatus for neural network hardware configuration is described. The method includes a decision making component configured to generate hardware configuration parameters for a neural network architecture based on hardware constraints and PPA constraints, a metrics computation component configured to compute a performance metric based on PPA constraints and a performance profile, a policy making component configured to compile an instruction set based on the hardware configuration parameters and a representation of a neural network architecture, and an emulator configured to produce a performance profile based on the hardware configuration parameters and the instruction set.

A method of using an apparatus for neural network hardware configuration is described. The method includes a decision making component configured to generate hardware configuration parameters for a neural network architecture based on hardware constraints and PPA constraints, a metrics computation component configured to compute a performance metric based on PPA constraints and a performance profile, a policy making component configured to compile an instruction set based on the hardware configuration parameters and a representation of a neural network architecture, and an emulator configured to produce a performance profile based on the hardware configuration parameters and the instruction set.

Some examples of the apparatus, system, and method described above further include a user interface configured to receive the PPA constraints from a user. Some examples of the apparatus, system, and method described above further include a design component configured to design an SNP based on the hardware configuration parameters. In some examples, the decision making component takes compiler constraints corresponding to the policy making component as input.

The description and drawings described herein represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

The described methods may be implemented or performed by devices that include a general-purpose processor, a DSP, an ASIC, a FPGA or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise RAM, ROM, electrically erasable programmable read-only memory (EEPROM), compact disk (CD) or other optical disk storage, magnetic disk storage, or any other non-transitory medium for carrying or storing data or code.

Also, connecting components may be properly termed computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ. Also the phrase "based on" is not used to represent a closed set of conditions. For example, a step that is described as "based on condition A" may be based on both condition A and condition B. In other words, the phrase "based on" shall be construed to mean "based at least in part on." Also, the words "a" or "an" indicate "at least one."

What is claimed is:

1. A method comprising:
generating hardware configuration parameters for a neural network hardware accelerator based on hardware constraints and compiler constraints, wherein the hardware configuration parameters include one or more memory sizes, one or more memory form factors, a number of multipliers, a topology of multipliers, or any combination thereof;
compiling a representation of a neural network architecture to produce a representation of an instruction set for implementing the neural network architecture based on the hardware configuration parameters and the compiler constraints;
simulating performance of the neural network architecture based on the hardware configuration parameters and the representation of the instruction set to produce a performance profile;
computing a performance metric based on the performance profile and power performance and area (PPA) constraints; and
iteratively updating the hardware configuration parameters for the neural network architecture based on the performance metric, simulating the performance of the neural network architecture, and recomputing the performance metric based on the updated hardware configuration parameters.

2. The method of claim 1, wherein:
the performance profile includes two or more parameters from a set comprising algorithm performance, power consumption, memory bandwidth, and chip area.

3. The method of claim 1, further comprising:
multiplying each parameter of the performance profile by a weight based on the PPA constraints; and
computing the performance metric based on a sum of each parameter of the performance profile multiplied by the corresponding weight, wherein the hardware configuration parameters are updated based on the sum.

4. The method of claim 1, further comprising:
iterating between computing the performance metric and updating the hardware configuration to produce final hardware configuration parameters.

5. The method of claim 4, wherein:
the iterating is based on simulated annealing.

6. The method of claim 4, wherein:
the iterating is based on stochastic gradient descent.

7. The method of claim 1, further comprising:
prompting a user to identify the PPA constraints; and
receiving the PPA constraints from the user based on the prompting.

8. The method of claim 1, further comprising:
generating a register-transfer level (RTL) design for the neural network architecture based on the hardware configuration parameters.

9. The method of claim 1, further comprising:
manufacturing a specific neural processor (SNP) based on the updated hardware configuration parameters.

10. The method of claim 1, wherein:
the neural network architecture comprises a convolutional neural network (CNN).

11. The method of claim 1, wherein:
the neural network architecture is configured to facial recognition tasks.

12. The method of claim 1, further comprising:
selecting the hardware configuration parameters to be optimized based on the neural network architecture.

13. A method for hardware acceleration, comprising:
generating hardware configuration parameters for a neural network architecture based on hardware constraints;
compiling a representation of the neural network architecture to produce a representation of an instruction set for implementing the neural network architecture based on the hardware configuration parameters;
simulating performance of the neural network architecture based on the hardware configuration parameters and the representation of the instruction set to produce a performance profile;
computing a performance metric by weighting parameters of the performance profile based on power performance and area (PPA) constraints; and
iteratively updating the hardware configuration parameters for the neural network architecture based on the performance metric, simulating the performance of the neural network architecture, and recomputing the performance metric based on the updated hardware configuration parameters.

14. The method of claim 13, wherein:
the hardware configuration parameters are generated based on compiler constraints, and the instruction set is compiled based on the compiler constraints.

15. An apparatus for hardware acceleration, comprising: a processor and a memory storing instructions and in electronic communication with the processor, the processor being configured to:
generate hardware configuration parameters for a neural network architecture based on hardware constraints and compiler constraints;
compute a performance metric based on power performance and area (PPA) constraints and a performance profile;
compile a representation of a neural network architecture to produce a representation of an instruction set for implementing the neural network architecture based on the hardware configuration parameters and the compiler constraints; and
simulate performance of the neural network architecture to produce a performance profile based on the hardware configuration parameters and the representation of the instruction set to produce a performance profile,
wherein the hardware configuration parameters for the neural network architecture are iteratively updated based on computing the performance metric, simulating the performance of the neural network architecture, and recomputing the performance metric based on the updated hardware configuration parameters.

16. The apparatus of claim 15, further comprising:
a user interface configured to receive the PPA constraints from a user.

17. The apparatus of claim 15, further comprising:
a design component configured to design a specific neural processor (SNP) based on the hardware configuration parameters.

18. The apparatus of claim 15, wherein:
the decision making component takes compiler constraints corresponding to the policy making component as input.

\* \* \* \* \*